US009325490B2

(12) United States Patent
Tiwari et al.

(10) Patent No.: US 9,325,490 B2
(45) Date of Patent: Apr. 26, 2016

(54) REFERENCELESS CLOCK AND DATA RECOVERY CIRCUIT

(71) Applicant: STMicroelectronics International N.V., Amsterdam (NL)

(72) Inventors: Anurag Tiwari, Noida (IN); Kallol Chatterjee, Kolkata (IN)

(73) Assignee: STMicroelectronics International N.V., Amsterdam (NL)

( * ) Notice: Subject to any disclaimer, the term of this patent is extended or adjusted under 35 U.S.C. 154(b) by 16 days.

(21) Appl. No.: 14/221,162

(22) Filed: Mar. 20, 2014

(65) Prior Publication Data

US 2015/0270947 A1 Sep. 24, 2015

(51) Int. Cl.
  *H03D 3/24* (2006.01)
  *H04L 7/027* (2006.01)
  *H03L 7/087* (2006.01)
  *H04L 7/033* (2006.01)

(52) U.S. Cl.
  CPC ............. *H04L 7/027* (2013.01); *H03L 7/087* (2013.01); *H04L 7/0331* (2013.01); *H04L 7/0332* (2013.01)

(58) Field of Classification Search
  CPC ..... H04L 7/027; H04L 7/0331; H04L 7/0332; H03L 7/087; H03L 7/22–7/235; H03L 7/10–7/12; H03L 7/099–7/0998; H03L 7/085–7/097
  See application file for complete search history.

(56) References Cited

U.S. PATENT DOCUMENTS

| | | | |
|---|---|---|---|
| 6,807,225 B1 * | 10/2004 | Tonietto et al. | 375/219 |
| 7,099,407 B2 * | 8/2006 | Hasegawa et al. | 375/316 |
| 2001/0007436 A1 * | 7/2001 | Dosho et al. | 331/11 |
| 2004/0124929 A1 * | 7/2004 | Ishiwaki | H03L 7/087 331/1 R |
| 2006/0220711 A1 * | 10/2006 | Sanduleanu et al. | 327/157 |
| 2007/0064837 A1 * | 3/2007 | Meltzer | H03L 7/087 375/327 |
| 2008/0150588 A1 * | 6/2008 | Lin | H03D 13/004 327/12 |
| 2009/0015304 A1 * | 1/2009 | Yin et al. | 327/162 |
| 2010/0073051 A1 * | 3/2010 | Rao et al. | 327/157 |
| 2014/0333346 A1 * | 11/2014 | Bae et al. | 327/5 |

OTHER PUBLICATIONS

Donald Richman, "Color carrier reference phase synchronization accuracy in NTSC color television," Proceedings of the IRE, vol. 42, Issue 1, IEEE Journals & Magazines, Jan. 1954, pp. 106-133.

Declan Dalton, Kwet Chai, Eric Evans, Mark Ferriss, Dave Hitchcox, Paul Murray, Sivanendra Selvanayagam, Paul Shepherd, and Lawrence DeVito, "A 12.5-Mb/s to 2.7-Gb/s Continuous-Rate CDR With Automatic Frequency Acquisition and Data-Rate Readback", IEEE Journal of Solid-State Circuits, vol. 40, No. 12, Dec. 2005, pp. 2713-2725.

(Continued)

*Primary Examiner* — Dac Ha
(74) *Attorney, Agent, or Firm* — Gardere Wynne Sewell LLP

(57) ABSTRACT

A circuit and method for referenceless CDR with improved efficiency and jitter tolerance by using an additional loop for frequency detection. Such an improved circuit includes a frequency detector for identifying whether an initial recovered clock signal is faster or slower than the actual bit rate of the received data stream. The frequency detector provides a jitter tolerance of +/−0.5 UI and uses significantly fewer components that other conventional frequency detectors. Having fewer components, significantly less power is also consumed. In an embodiment, the FD uses only four flip-flops, two AND gates, and one delay circuit. Having fewer components also uses less die space in integrated circuits. Having high jitter tolerance and fewer components is an improvement over conventional referenceless CDR circuits.

27 Claims, 4 Drawing Sheets

(56) References Cited

OTHER PUBLICATIONS

P.E. Allen, Lecture 200—Clock and Data Recovery Circuits—I (Jun. 26, 2003), ECE 6440—Frequency Synthesizers, p. 200-1 to p. 200-32.

Jri Lee and Ke-Chung Wu, "A 20-Gb/s Full-Rate Linear Clock and Data Recovery Circuit With Automatic Frequency Acquisition", IEEE Journal of Solid-State Circuits, vol. 44, No. 12, Dec. 2009, pp. 3590-3602.

Lawrence DeVito, John Newton, Rosamaria Croughwell, John Bulzacchelli, Fred Benkley, "TPM 8.6 A 52MhZ and 155MHz Clock-Recovery PLL", 1991 IEEE International Solid-State Circuits Conference, pp. 3.

Ansgar Pottbacker, Ulrich Langmann, and Hans-Ulrich Schreiber, "A Si Bipolar Phase and Frequency Detector IC for Clock Extraction up to 8 Gb/s", IEEE Journal of Solid-State Circuits, vol. 21, No. 12, Dec. 1992, pp. 1747-1751.

\* cited by examiner

REFERENCELESS CLOCK AND DATA RECOVERY CIRCUIT

BACKGROUND

Digital data transmission between systems and devices is prevalent across many technologies. Data may be assembled at a specific clock rate at the transmitting device and transmitted to a receiver to receive the data and recover the data at the clock rate in which the digital data stream was assembled and/or transmitted. Some devices capable of transmitting digital data streams to other devices often do so without sending the accompanying clock signal used to assemble/transmit. Instead, the receiver may be configured to generate an appropriate clock signal for data recovery starting from an approximate frequency reference, and then analyzing the received data to decipher the actual clock frequency that the transmitter used. Such a referenceless clock and data recovery (CDR) scheme then alleviates the need to use bandwidth and/or additional signal lines for the data clock signal between transmitter and receiver.

To this end, Synchronous Optical Networking (SONET) and Synchronous Digital Hierarchy (SDH) are standardized protocols that have been established for multiple digital bit streams transmissions over optical fiber using lasers or highly coherent light from light-emitting diodes (LEDs). Conventional CDR schemes involve passing the digital data stream through a phase-locked loop (PLL) such that the transitions in the received digital stream (e.g., the transitions from logic 1 to logic 0 and vice versa) are analyzed to decipher and lock in the clock rate in which the data may be recovered. In order for a CDR scheme to work, the digital data stream must transition frequently enough to correct for any drift in the PLL's oscillator. Further, in order to meet industry standards, the digital data stream between the transmitter and receiver must be greater than specific threshold bandwidths. For example, the Optical Carrier 192 SONET Specification for optical communication requires bit rates of greater than 9 GBPS. Thus, in order to meet this bit rate, a referenceless CDR in a receiver should have a jitter tolerance (JTOL) of at least +/−0.375 UI.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a circuit and method for referenceless CDR with improved efficiency and jitter tolerance by using an additional loop for frequency detection. Such an improved circuit includes a frequency detector (FD) for identifying whether an initial recovered clock signal is faster or slower than the actual bit rate of the received data stream. The FD provides a jitter tolerance of +/−0.5 UI and uses significantly fewer components that other conventional frequency detectors. Having fewer components, significantly less power is also consumed. In an embodiment, the FD uses only four flip-flops, two AND gates, and one delay circuit. Having fewer components also uses less die space in integrated circuits. Having high jitter tolerance and fewer components is an improvement over conventional referenceless CDR circuits. These aspects are described in greater detail below with respect to FIGS. 1-4.

Figure 1:
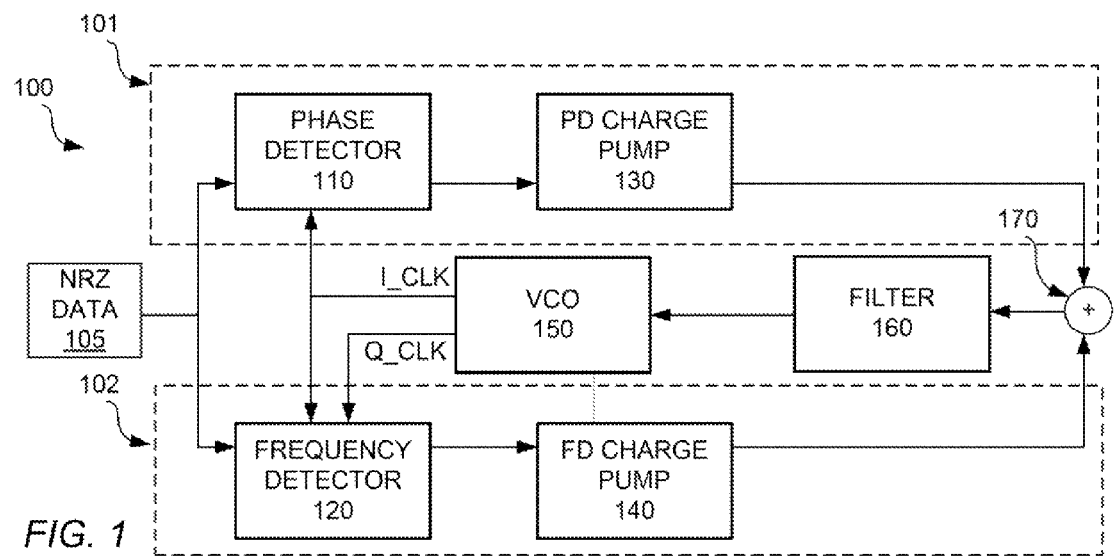
FIG. 1 is a block diagram of a referenceless clock and data recovery circuit according to an embodiment of the subject matter disclosed herein.

FIG. 1 is a block diagram of a referenceless clock and data recovery (CDR) circuit according to an embodiment of the subject matter disclosed herein. The referenceless CDR 100 may be part of a receiver (not shown) configured to receive a stream of bits at a data input 105. In one embodiment, the stream of bits may be a non-return-to-zero (NRZ) stream of bits. As discussed briefly above, a referenceless CDR circuit 100 is configured to determine a data-clock rate corresponding to the received stream of bits by analyzing just the received stream of bits. That is, only the data itself is received and not a separate clock signal. Such an arrangement is beneficial for reducing a need for a signal line dedicated to the data-clock signal and a separate data-clock input pin on a receiver chip. Further, it may allow a transmitter (not shown) to omit a crystal oscillator for generating the data-clock signal for transmission to the receiver.

FIG. 1 shows an embodiment of a referenceless CDR circuit 100 as a dual-loop CDR circuit. The first loop 101 includes a phase detector (PD) HO in conjunction with a phase detector charge pump 120 that function as a phase-locked loop (PLL) when an up or down signal from the phase detector charge pump 120 is fed back to a voltage controlled oscillator (VCO) 150 through a common loop filter 160. The second loop 102 includes a frequency detector (FD) 120 in conjunction with a frequency detector charge pump 140 that function as a frequency-locked loop (FLL). The frequency detector charge pump 140 also generates an up or down signal that is fed back to the VCO 150 through the common loop filter 160. Both loops 101 and 102 generate a feedback signal back to the common loop filter 160 and the VCO 150 though a summing circuit 170.

The VCO 150 generates a data clock signal intended to be the recovered data clock signal that is be locked with the actual data bit rate of the data stream. This recovered data clock signal in denoted as I_CLK. Additionally, the VCO 150 also generates another clock signal Q_CLK which is quadrature shifted (lags by 90 degrees) from the recovered data-clock signal I_CLK. As will be discussed in greater detail below, the frequency detector 120 uses these two VCO-generated signals to assist with locking in the recovered data-clock signal I_CLK.

The PLL 101 is configured to lock to a recovered data-clock frequency that is recoverable from the data stream (e.g., the PLL 101 may lock the recovered data-clock signal to the rising edges of the data). Once the recovered data-clock signal is "locked" in by the PLL 101, the continuous phase comparisons between the incoming data signal at the data input 105 and the I_CLK signal generated by the VCO 150 ensures that adjustments up or down are made to ensure that the frequency of the data stream matches the frequency of the generated data-clock signal I_CLK. Getting to the locked in state, however, typically means that the initial generated data-clock signal I_CLK should be reasonably close to the actual frequency of the data stream such that the PLL 101 can "pull in" the data-clock signal I_CLK to match the data stream. But the pull-in range (often called capture range as used hereinafter) of the PD 110 in the PLL 101 may be limited, such as for applications in which the data stream bit rate is greater than about 9.0 GBPS. The limited capture range of PD 110 is its fundamental property independent of any data or clock rate. Typical capture range of the PLL 101 is on the order of the overall loop-bandwidth. To comply with SONET, a typical loop bandwidth is on the order of 2-6 MHz and therefore, the capture range of the PLL 101 is of the order of 2000 part per million (ppm) to 6000 ppm corresponding to 10.3 GHz data-clock rate.

Thus, in order to account for the limited capture range of the PLL 101, the FLL 102 is used initially because of a greater capture range. Initially, the FLL 102 allows the referenceless CDR circuit 100 to pull-in the VCO 150 frequency of the recovered data-clock signal I_CLK toward the frequency of the data-stream. Then, when the VCO 150 frequency is pulled in by a suitable amount (for example to less than 5000 ppm difference from the data stream), the PLL 101 can capture and lock the frequency and phase of the recovered data-clock signal I_CLK to the frequency and phase of the data stream. The operation of the referenceless CDR circuit 100 may be better understood with reference to the timing and phase diagrams of FIGS. 2 and 3, respectively as discussed next.

Figure 2:
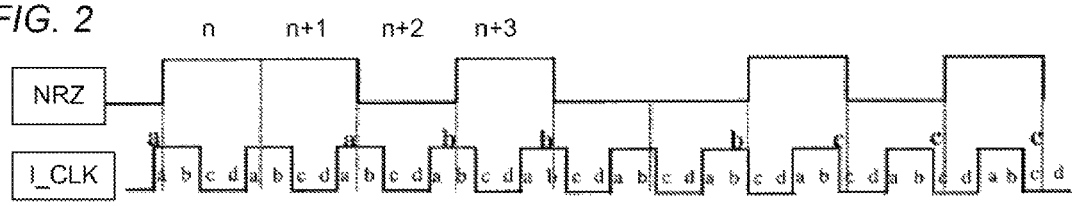
FIG. 2 is a timing diagram of an NRZ data stream in comparison to an initial recovered data-clock signal according to an embodiment of the subject matter disclosed herein.
Figure 3:
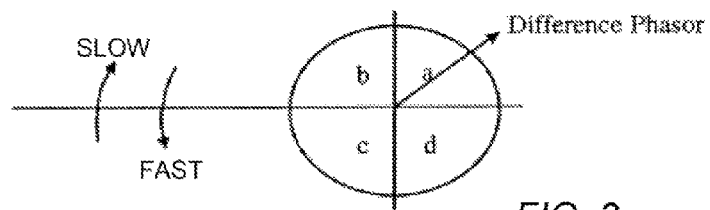
FIG. 3 is a phase diagram corresponding to the timing diagram of FIG. 2 according to an embodiment of the subject matter disclosed herein.

FIG. 2 is a timing diagram of an NRZ data stream in comparison to an initial recovered data-clock signal according to an embodiment of the subject matter disclosed herein. Further, FIG. 3 is a phase diagram corresponding to the timing diagram of FIG. 2 according to an embodiment of the subject matter disclosed herein. In the timing diagram of FIG. 2, the NRZ data stream is a series of bits representing a logic-1 or a logic-0. The bit rate of the NRZ data stream is set at transmission such that the receiver uses the referenceless CDR of FIG. 1 to determine a recovered data-clock signal I_CLK which is initially represented below the NRZ data stream in the timing diagram of FIG. 1. The dashed lines extending down to the I_CLK signal represent the time divisions between data bots in the NRZ data stream. Thus, as one can see, the first bit in position n is high representing a logic-1. Position n+1 did not have a transition so the data bit remain logic-1. Then, at position n+2, the NRZ data stream does transition to logic-) and then back to logic-1 at position n+3.

Thus, at the potential rising or falling edges of the NRZ data stream, when a transition does occur, the FD 120 can determine a relative difference in the frequency of an initial recovered data-clock signal and the actual NRZ data frequency by analyzing when rising or falling edges do occur with respect to the I_CLK and Q_CLK signals. This is illustrated in the timing diagram of FIG. 2 wherein each period of the I_CLK signal may be divided into four quadrants a, b, c, d. These four quadrants are shown in the phase diagram of FIG. 3. Therefore, given that an initial frequency difference may result in the potential NRZ data stream edges (i.e., the dashed lines) not being exactly aligned with the rising edges of the recovered data-clock signal I_CLK, one can decipher a relative frequency difference by tracking which frequency quadrant the actual NRZ data stream edges occur.

In the example of FIG. 2, the first edge of the NRZ data stream is shown as falling in quadrant a. FIG. 3 shows this first difference phasor in quadrant a as well. The second edge of the NRZ data stream is shown as also falling in quadrant a, but closer to quadrant b than the first edge. (FIG. 3 only shows the first difference phasor.) The third edge of the NRZ data stream is shown as falling in quadrant b and the fourth edge is even further into quadrant b. Thus, one can see that the recovered data-clock signal I_CLK is too fast at this initial onset. If one were to chart the difference phasors in FIG. 3, the phasor would be rotating counter-clockwise indicating that the recovered data-clock signal I_CLK is too fast. If the recovered data-clock signal I_CLK is too slow, the difference phasor would rotate clockwise.

In a locked scenario, one would expect that the rising and falling edges of the NRZ data stream would be occur as close as possible with the rising edges of the recovered data-clock signal I_CLK. In terms of the phase diagram of FIG. 3, one would expect to see the difference phasor vacillating slightly between quadrants a and d indicating that the phase and frequency of the recovered data-clock signal I_CLK are locked to the NRZ data stream bit rate. However, if the FD 120 identifies the NRZ data stream edges rotating in a direction from quadrants a→b→c→d, then the recovered data-clock signal I_CLK is too fast. Thus, the FD charge pump 140 may acts to lower the VCO 150 frequency. In contrast, if the FD 120 identifies the NRZ data stream edges rotating in a direction from quadrants a→d→c→b, then the recovered data-clock signal I_CLK is too slow. Thus, the FD charge pump 140 may act to raise the VCO 150 frequency.

To this end, the FD 120 may determine the logic level of the two clock signals I_CLK and Q_CLK at the time of a detected edge on the NRZ data stream and assign a two-bit binary identification to the quadrant in which the edge is detected. That is, one can represent the quadrants a, b, c, and d of the recovered data-clock signal I_CLK with the binary values (I_CLK, Q_CLK), such that a=(1,0), b=(1,1), c=(0,1), and d=(0,0). Therefore, in response to the quadrant detected, the FD 120 can generate an UP or DOWN (DN hereinafter) charge-pump signal when these changes indicate a respective quadrant rotation as described above.

Because the second FLL 102 of the dual-loop referenceless CDR circuit 100 may only be needed during initial signal capture, which is a relatively short time compared to the entire time during which the referenceless CDR circuit 100 is operating, it is desirable that the frequency detector FD 120 use as little power as possible (i.e., lowest number of components) while it is "idling" until it may be needed again. For example, e.g., there is a significant shift in the NRZ data stream frequency or the NRZ data stream stops for a while and then starts back up again such that the referenceless CDR circuit 100 must again acquire the data clock.

It is also desirable that the FD 120 be jitter tolerant, so that a jitter in the NRZ data stream does not "fool" the FD 120 into thinking that there is an actual change in the NRZ data stream frequency. If a jitter does "fool" the FD 120, then the activation of the FD 120 may actually cause the PLL 101 to lose lock on the recovered data-clock frequency I_CLK, and this may cause a period of time where received NRZ data stream is lost or includes errors. Thus, and embodiment of a FD 120 is described below with respect to FIG. 4 that meets the desirable features of low component count (low power consumption) and high jitter tolerance.

Figure 4:
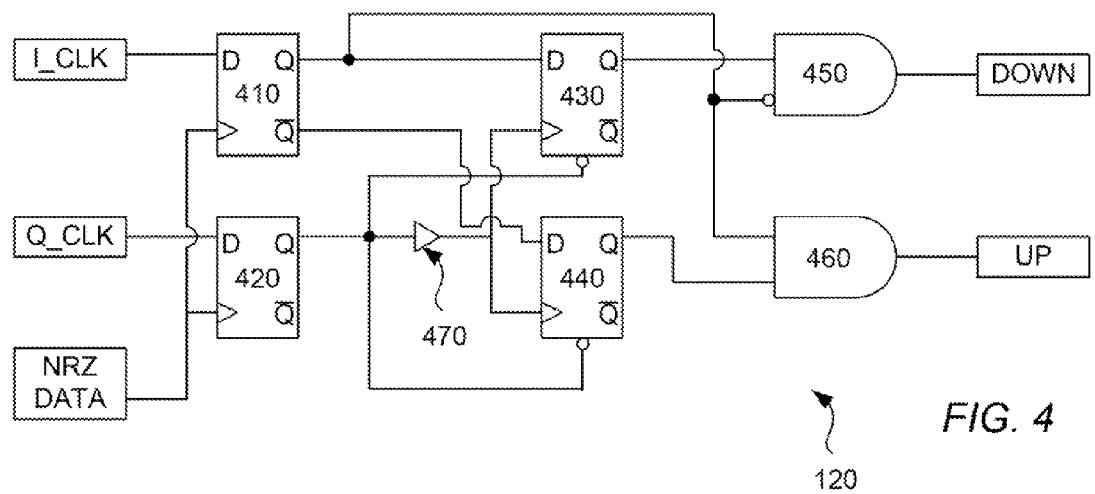
FIG. 4 is a phase detector circuit of a referenceless clock and data recovery circuit according to an embodiment of the subject matter disclosed herein.

FIG. 4 is a frequency detector circuit 120 of a referenceless clock and data recovery circuit according to an embodiment of the subject matter disclosed herein. The FD 120 includes three input signals shown on the left side of the circuit diagram, NRZ data stream 105, I_CLK and Q_CLK. As discussed above, the Q_CLK signal is a quadrature shifted (90 degree lag) version of the I_CLK signal.

The FD 120 includes two initial D-type flip-flops 410 and 420 that capture the logic state of I_CLK and Q_CLK at an edge of the NRZ data stream. Flip-flop 410 captures the I_CLK logic state and flip-flop 420 captures the Q_CLK logic state. Further, these flip-flops are triggered by a rising edge of the NRZ data stream as the NRZ data stream input is coupled to the clock of each flip-flop 410 and 420. In other embodiments, the falling edges of the NRZ data stream may trigger these flip-flops 410 and 420, but for the remainder of this discussion, a rising edge trigger of the NRZ data stream will be used to illustrate the working principles of the FD 120. Thus, on the rising edge of the NRZ data stream, the logic state of each clock signal I_CLK and Q_CLK is captured by the respective flip-flops 410 and 420 and these logic signals are latched at each respective Q output. The Q-outputs of these flip-flops 410 and 420 represent the quadrant in which the edge was detected as a binary values (I_CLK, Q_CLK), such that a=(1,0), b=(1,1), c=(0,1), and d=(0,0).

With the initial quadrant detected by flip-flops 410 and 420, a second set of flip-flops 430 and 440 may be used to determine the direction of the rotation of the difference phasor as described above. Thus, the second set of flip-flops are triggered at their respective clock inputs by the Q-output of the initial Q_CLK flip flop 420 after this signal passes through an inverter 470. Further, the second set of flip-flops 430 and 440 are reset by the Q-output of the initial Q_CLK flip flop 420 prior to inversion. In this manner, the second set of flip-flops 430 and 440 are always reset just before the Q-output of the initial Q_CLK flip flop 420 triggers them (e.g., after the delay of the inverter.

When triggered by the Q-output of the initial Q_CLK flip flop 420, the flip-flop 430 will latch the Q-output of the initial I_CLK flip flop 410. Additionally, the flip-flop 440 will latch the Q-naught output of the initial I_CLK flip flop 410 at the same triggering. In this manner the second set of slip-flops 430 and 440 capture the respective logic states of the Q-output and Q-naught output the initial I_CLK flip flop 410 at a time shortly after the triggering of the first set of flip-flops 410 and 420.

With these various latched signals from the flip-flops 410, 430 and 440, two AND gates 450 and 460 may be used to determine combinations of these signal that would warrant generating a UP signal (from AND gate 450) to the FD charge pump or DN signal (from AND gate 460). The UP AND gate 450 includes inputs for the Q-output of the initial I_CLK flip flop 410 (though inverted at the input) and the Q-output of the flip flop 430. The DN AND gate 460 includes inputs for the Q-output of the initial I_CLK flip flop 410 and the Q-naught output of the flip flop 440.

With the above-described latching scheme in place, the FD 120 is able to determine logically if consecutive rising edges of the NRZ data stream have transitioned from one specific quadrant to another specific quadrant. Thus, a DN signal (from DN AND gate 450) is generated if consecutive rising edges of the NRZ data stream shift from quadrant b=(1,1) to quadrant c=(0,1). Similarly, a UP signal (from UP AND gate 460) is generated if consecutive rising edges of the NRZ data stream shift from quadrant c=(0,1) to quadrant b=(1,1). The operation of this circuit may be better understood with reference to the timing diagram of FIG. 5A showing an example of the generation of the DN signal and FIG. 5B showing an example generation of the UP signal.

Figure 5A:
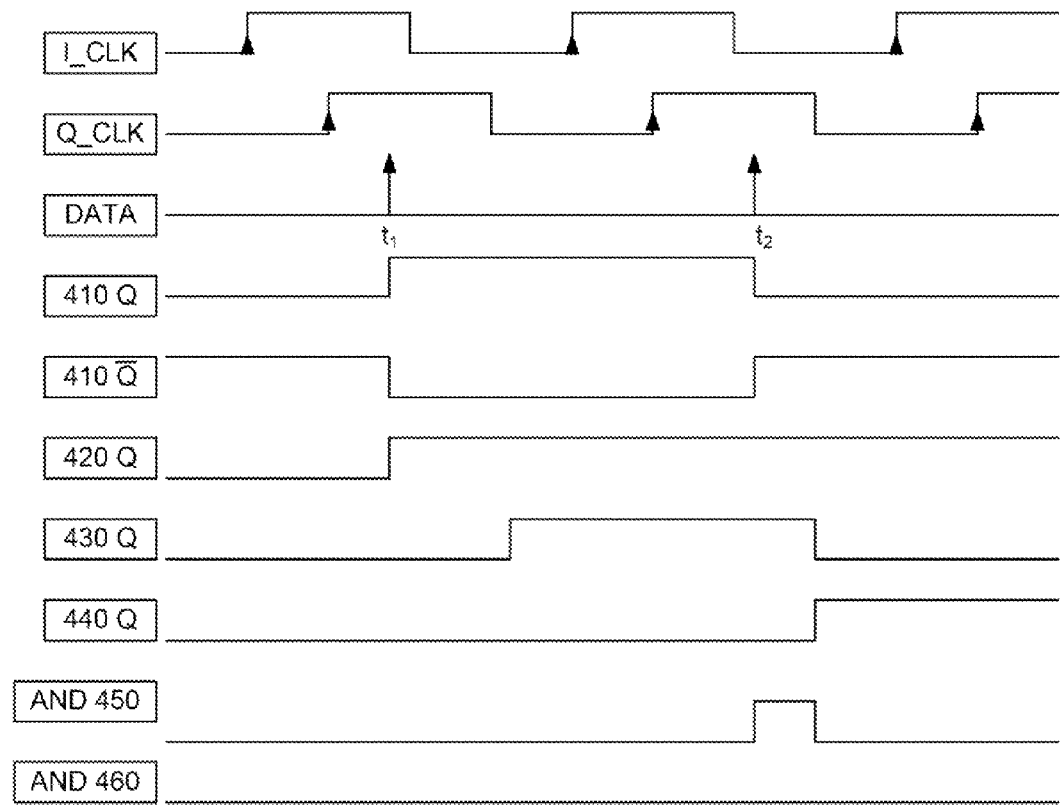
FIGS. 5A and 5B are timing diagrams of a data stream in comparison to a recovered clock signal for locking in the recovered clock rate from the data signal according to an embodiments of the subject matter disclosed herein.
Figure 5B:
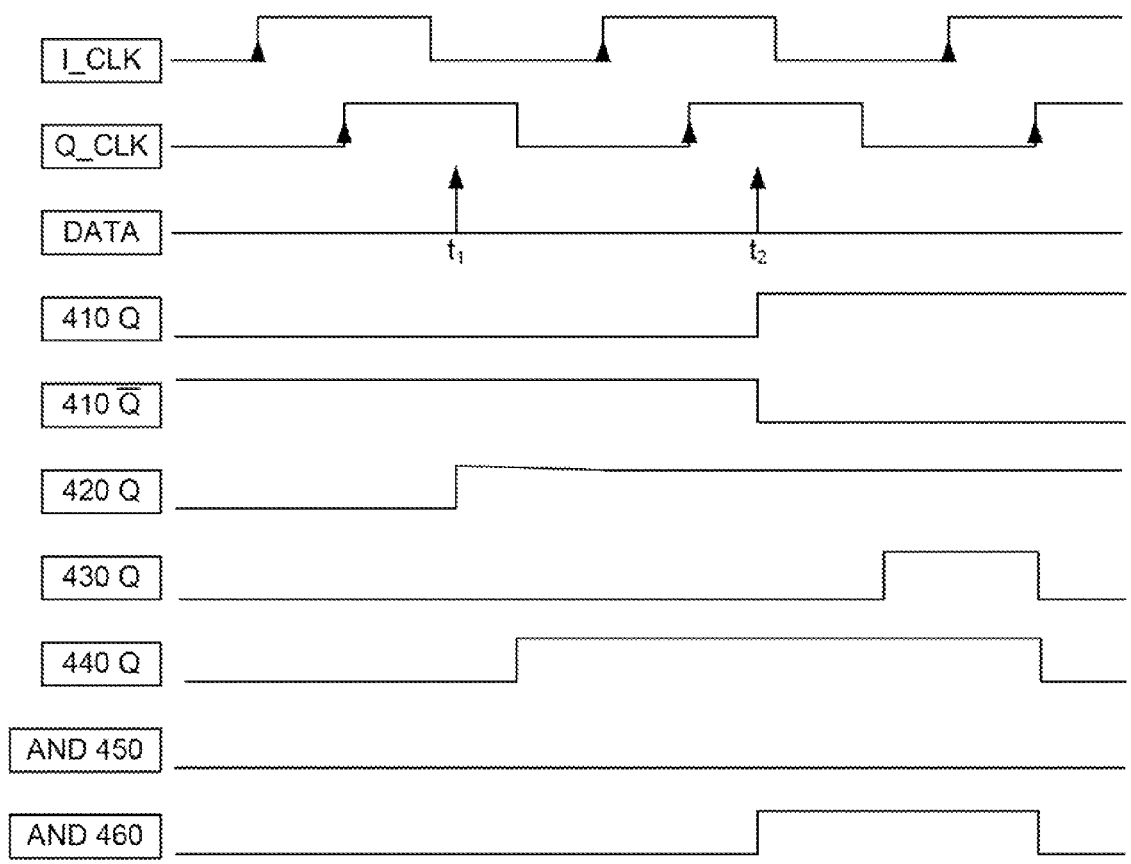

FIGS. 5A and 5B are timing diagrams of a data stream in comparison to a recovered clock signal for locking in the recovered clock rate from the data signal according to an embodiments of the subject matter disclosed herein. In the first example of FIG. 5A, the I_CLK and Q_CLK signals are set to some initial frequency and one can see that the Q_CLK is quadrature shifted and lags the I_CLK by one fourth of the clock period (e.g., 90 degrees). In determining where consecutive edges of the NRZ data stream may fall, this example shows a first edge at t1 and a second edge at t2. For the sake of the example, it is assumed that prior to t1, all flip-flops are reset such that all Q outputs are set to a logic-0.

Thus, at t1, when the first edge of the NRZ data stream is detected, the first and second flip-flops 410 and 420 (FIG. 4) are triggered (by the NRZ data stream edge detected at t1) and the current logic level of the I_CLK and the Q_CLK are latched to the Q outputs of flip-flops 410 and 420 respectively. In this first example, the t1 edge is shown in quadrant b, such that both the I_CLK and Q_CLK signal is at logic-1. Thus, the Q-output of flip-flop 410 rises to logic-1 as does the Q-output of flip-flop 420. Of course, the logic level of the Q-naught output of flip-flop 410 falls to logic-0. The Q-output of flip-flop 420 also resets the second set of flip-flops 430 and 440.

At this point, the second set of flip-flops 430 and 440 will now latch when the Q_CLK sees a falling edge (since the Q-output of the flip-flop 420 is coupled to the reset of flipsflops 430 and 440 and coupled to the clock pins through inverter 470). Further, it is the falling edge because of the inverter 470 here. Thus, at the next falling edge of Q_CLK, one can see that flip-flops 430 and 440 latch the D inputs (after a small delay from the inverter 470). In flip-flop 430, it is the Q-output of flip-flop 410 which is still logic-1. In flip-flop 440, it is the Q-naught output of flip-flop 410 which is still logic-0. These signals will hold until the reset pin is set when the Q-CLK next sees a rising edge.

At next pass, the next edge t2 of the NRZ data stream may occur in quadrant c. In quadrant c, the I_CLK signal falls to logic-0 but the Q-CLK signal remains at logic-1. Thus, the outputs of flip-flop 410 change as the Q-output falls to logic-0 and the Q-naught output rises to logic-1. The Q-output of flip flop 420 remains at high logic level, since the Q-CLK sis not change logic levels at the next edge t2 of the NRZ data stream.

At this point, the second set of flip-flops 430 and 440 will now latch when the Q_CLK again sees a falling edge. Thus, at the next falling edge of Q_CLK, one can see that flip-flops 430 and 440 latch the D inputs (after a small delay from the inverter 470). In flip-flop 430, it is the Q-output of flip-flop 410 which is now logic-0. Thus, at the next falling edge of the Q-CLK, a logic-0 is latched into flip-flop 430. In flip-flop 440, it is the Q-naught output of flip-flop 410 which is now logic-1. These signals will hold until the reset pin is set when the Q-CLK again next sees a rising edge.

With signals propagating through all flip-flops 410, 420, 430, and 440 at this point, it has been established that the edge of the NRZ data stream was detected in quadrant c having just been detected at t1 in quadrant b. Thus, transitioning from b to c is interpreted as the recovered data-clock signal I_CLK as being too slow. Thus, the AND gate 450 shows a pulse aligned with logic-1 signal at the Q-output of flip-flop 430 and the logic-0 signal at the Q-output of flip-flop 410. This UP pulse ends when flip-flop 430 is reset on the next falling edge of Q_CLK.

Turning to FIG. 5B, in the second example, the I_CLK and Q_CLK signals are again set to some initial frequency and one can see that the Q_CLK is quadrature shifted and lags the I_CLK by one fourth of the clock period. This example shows a first edge at t1 in quadrant c and a second edge at t2 in quadrant b. Thus, at t1, when the first edge of the NRZ data stream is detected, the first and second flip-flops 410 and 420 are triggered (by the NRZ data stream edge detected at t1) and the current logic level of the I_CLK and the Q_CLK are latched to the Q outputs of flip-flops 410 and 420 respectively. In this first example, the t1 edge is shown in quadrant c, such that the I_CLK signal is at logic-0 and the Q_CLK signal is at logic-1. Thus, the Q-output of flip-flop 410 remains at logic-0 but the Q-output of flip-flop 420 rises to logic-1. Of course, the logic level of the Q-naught output of flip-flop 410 also remains at logic-1. The Q-output of flip-flop 420 also resets the second set of flip-flops 430 and 440.

At this point, the second set of flip-flops 430 and 440 will now latch when the Q_CLK sees a falling edge. Thus, at the next falling edge of Q_CLK, one can see that flip-flops 430 and 440 latch the D inputs (after a small delay from the inverter 470). In flip-flop 430, it is the Q-output of flip-flop 410 which is still logic-0. In flip-flop 440, it is the Q-naught output of flip-flop 410 which is still logic-1. These signals will hold until the reset pin is set when the Q-CLK next sees a rising edge.

At next pass, the next edge t2 of the NRZ data stream may occur in quadrant b. In quadrant b, the I_CLK signal rises to logic-1 and the Q-CLK signal remains at logic-1. Thus, the outputs of flip-flop 410 change as the Q-output rises to logic-1 and the Q-naught falls rises to logic-0. The Q-output of flip flop 420 remains at high logic level, since the Q-CLK does not change logic levels at the next edge t2 of the NRZ data stream.

At this point, the second set of flip-flops 430 and 440 will now latch when the Q_CLK again sees a falling edge. Thus, one can see that flip-flops 430 and 440 latch the D inputs (after a small delay from the inverter 470). In flip-flop 430, it is the Q-output of flip-flop 410 which is now logic-0. Thus, at the next falling edge of the Q-CLK, a logic-0 is latched into flip-flop 430. In flip-flop 440, it is the Q-naught output of flip-flop 410 which is now logic-1. These signals will hold until the reset pin is set when the Q-CLK again next sees a rising edge.

With signals propagating through all flip-flops 410, 420, 430, and 440 at this point, it has been established that the edge of the NRZ data stream was detected in quadrant b having just been detected at t1 in quadrant c. Thus, transitioning from c to b is interpreted as the recovered data-clock signal I_CLK as being too fast. Thus, the AND gate 460 shows a pulse aligned with logic-1 signal at the Q-output of flip-flop 440 and the logic-1 signal at the Q-output of flip-flop 410. This DN pulse ends when flip-flop 440 is reset on the next falling edge of Q_CLK.

The width of UP/DN pulses from the FD 120 on the AND gates 450 and 460 may depend upon the difference in NRZ data stream bit rate and recovered data-clock frequency I_CLK run length. That is, if the NRZ data stream has a larger run length (maximum number of allowable consecutive logic-1 bits or logic-0 bits), the larger difference will provide more UP/DN pulses in a given time-interval although with widths that are more narrow. For smaller de-tune, the UP/DN pulses will be wider but fewer will be produced in a given time interval. Hence, the net correction provided by FD 120 will be proportional to this difference for reasonable run-lengths. In effect, the bandwidth of the FLL 102 becomes smaller as the FLL acquires the lock frequency and pulls in the recovered data-clock. Once the PLL 101 is able to finalize the locked in condition e.g., within a maximum JTOL of +/−0.5 UI, the FD simply shuts-off, such that the FLL 102 is open. In the presence of noise, exceeding the JTOL may turn the FLL 102 back on such that the FD 120 may again determine quadrants where consecutive edges of the NRZ data stream are occurring.

Figure 6:
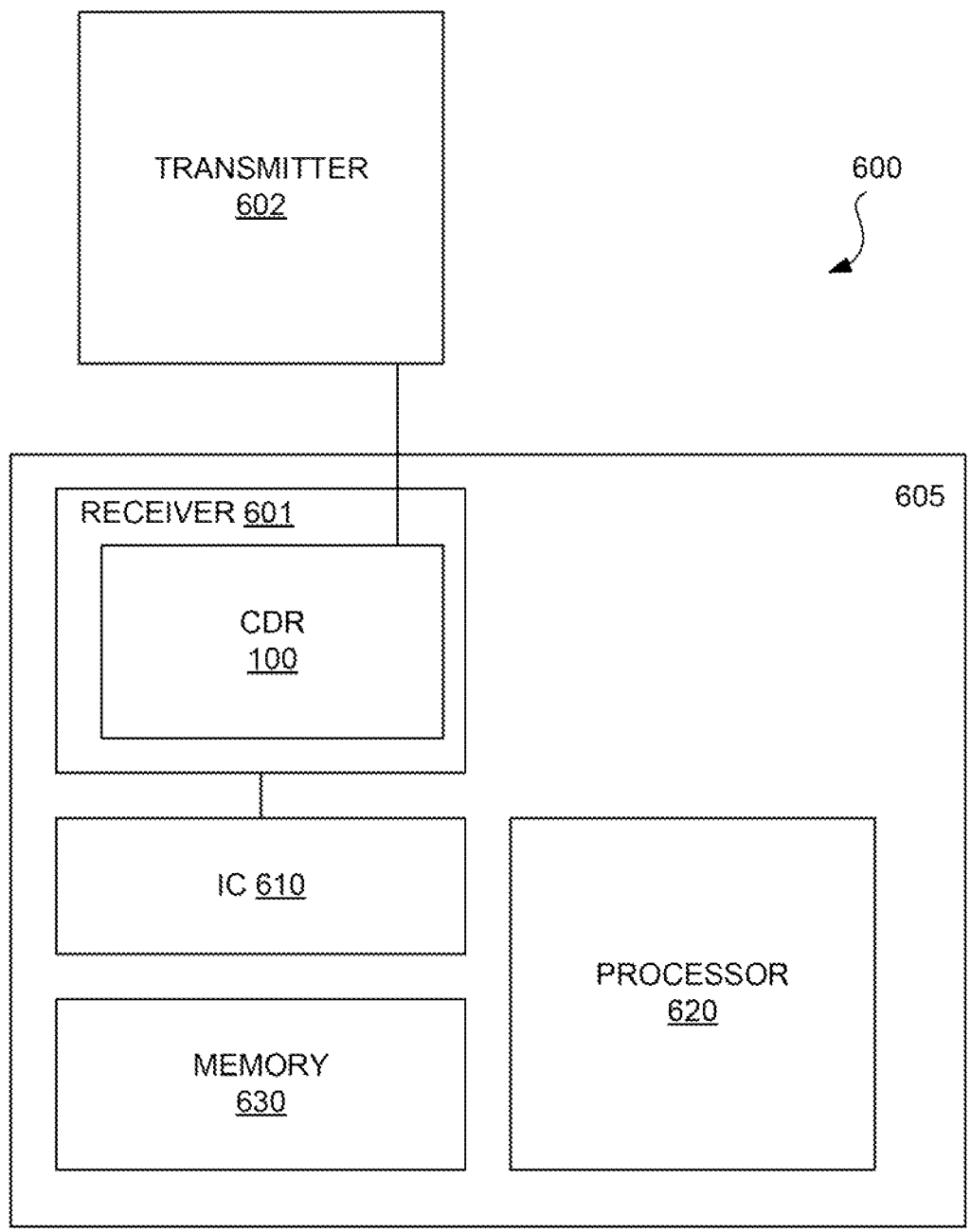
FIG. 6 is a system suited for using the referenceless clock and data recovery circuit of FIG. 1 according to an embodiment of the subject matter disclosed herein.

FIG. 6 is a system suited for using the referenceless clock and data recovery circuit of FIG. 1 according to an embodiment of the subject matter disclosed herein. The system 600 may include be a receiver 601 and a transmitter 602. The receiver and the transmitter may be communicatively coupled to each. Further the receiver may be part of a device 605. The receiver 601 may be an integrated circuit disposed on a single integrated circuit die or on multiple integrated circuit dies. The receiver includes a referenceless CDR circuit 100 as discussed above. The system 600 may further include a second integrated circuit 610 coupled to the receiver 601 which may also be an integrated circuit These integrated circuits may be formed on respective integrated circuit dies or may be formed on a single integrated circuit die. Further yet, the integrated circuits may also be communicatively coupled to a processor 620 and a memory 630, individually or collectively. Each of the additional components may be formed from the same integrated circuit dies as well or may comprise separate integrated circuit dies.

Such a system as shown in FIG. 6 may be any suitable application that may take advantage of transmitting and receiving digital data streams without any accompanying clock signal. One particular example may be low-power sensors that have limited power available and/or limited die space for an integrated circuit having the receiver 601. Thus, the device 605 may comprise an optical receiver suited to receive optical signals from the transmitter 602.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A device, comprising:
   a data input configured to receive a stream of data bits;
   a first detection loop part coupled to the data input and configured to compare a phase of the stream of data bits to that of a first clock signal and generate a phase error signal based thereupon;
   a second detection loop part coupled to the data input and configured to compare a frequency of the stream of data bits to that of a second clock signal and generate a frequency error signal based thereupon; and
   a common loop part comprising a voltage controlled oscillator coupled to the first and detection loop parts and configured to generate the first and second clock signals as a function of a sum of the phase error signal and the frequency error signal;
   wherein the first clock signal and second clock signal are in quadrature with each other.

2. The device of claim 1, wherein a phase-lock loop is formed by the first detection loop and the common loop part and comprises a phase detector coupled to the data input.

3. The device of claim 2, wherein the phase-lock loop further comprises a charge pump coupled to the phase detector and configured to generate an up signal or a down signal in response to a phase detection by the phase detector.

4. The device of claim 1, wherein a frequency-lock loop is formed by the second detection loop and the common loop part and comprises a frequency detector coupled to the data input.

5. The device of claim 4, wherein the frequency-lock loop further comprises a charge pump coupled to the frequency detector and configured to generate an up signal or a down signal in response to a frequency detection by the frequency detector.

6. The device of claim 4, wherein the frequency detector comprises:
a first flip-flop having an input coupled to the first clock signal and having an inverted output and a non-inverted output; and
a second flip-flop having an input coupled to the second clock signal and having an output.

7. The device of claim 6, wherein the frequency detector further comprises:
a third flip-flop having an input coupled to the non-inverted output of the first flip-flop and having an output; and
a fourth flip-flop having an input coupled to the inverted output of the first flip-flop and having an output.

8. The device of claim 7, wherein the frequency detector further comprises:
a first AND gate having a first input coupled to the inverted output of the first flip-flop and having a second input coupled to the output of the third flip-flop, the first AND gate configured to generate a down adjustment signal; and
a second AND gate having a first input coupled to the non-inverted output of the first flip-flop and having a second input coupled to the output of the fourth flip-flop, the second AND gate configured to generate an up adjustment signal.

9. The device of claim 7, wherein:
the first flip-flop comprises a clock input coupled to the data input;
the second flip-flop comprises a clock input coupled to the data input;
the third flip-flop comprises a reset coupled to the output of the second flip-flop and comprises a clock input coupled to an inverter that is coupled to the to the output of the second flip-flop; and
the fourth flip-flop comprises a reset coupled to the to the output of the second flip-flop and comprises a clock input that is coupled to the inverter.

10. The device of claim 1, further comprising a filter coupled to the voltage controlled oscillator.

11. An integrated circuit, comprising:
a data input configured to receive a stream of data bits;
a first detection loop coupled to the input and configured to generate a phase error signal from a first clock signal and the stream of data bits;
a second detection loop coupled to the input and configured to generate a frequency error signal recover from a second clock signal and the stream of data bits; and
a voltage controlled oscillator coupled to the first detection loop and coupled to the second detection loop and configured to adjust the first and second clock signals in response to a sum of the phase and frequency error signals;
wherein the first clock signal and second clock signal are in quadrature with each other.

12. The integrated circuit of claim 11, wherein:
the first detection loop comprises a phase-lock loop having a phase detector coupled to the data input and a charge pump coupled to the phase detector and configured to generate an up signal or a down signal in response to a phase detection by the phase detector; and
wherein the second detection loop comprises a frequency-lock loop having a frequency detector coupled to the data input and a charge pump coupled to the frequency detector and configured to generate an up signal or a down signal in response to a frequency detection by the frequency detector.

13. The integrated circuit of claim 12, wherein the frequency detector is comprised of only four flip-flops, two AND gates and one inverter.

14. The integrated circuit of claim 11, further comprising a single integrated circuit die.

15. The integrated circuit of claim 11, further comprising a plurality of integrated circuit dies.

16. A method, comprising:
receiving, at a receiver, a stream of data bits having an embedded clock signal;
determining a frequency range of the embedded clock signal using a first detection loop, the frequency range determined to within a first range;
generating a recovered clock signal having a frequency in the first range and locking in the frequency of the recovered clock signal with the embedded clock signal using a second detection loop after determining the frequency range;
monitoring the frequency of the embedded clock signal by determining a frequency of the embedded clock signal in relation to the frequency of the recovered clock signal and in relation to a third clock signal that has a frequency that is quadrature shifted from the frequency of the recovered clock signal; and
adjusting the frequency of the recovered clock signal in response to changes to the frequency of the embedded clock signal.

17. The method of claim 16, wherein using the first detection loop further comprises using a frequency-lock loop to determine the frequency range to within a range of 2-6 MHz.

18. The method of claim 16, wherein using the first detection loop further comprises using a phase-lock loop to lock in the frequency of the embedded clock signal.

19. A device, comprising:
a data input configured to receive a stream of data bits;
a first detection loop coupled to the data input and configured to recover a first clock signal from the stream of data bits;
a second detection loop coupled to the data input and configured to recover a second clock signal from the stream of data bits, the second detection loop comprising a frequency lock loop having a frequency detector coupled to the data input, wherein the frequency detector comprises a first flip-flop having an input coupled to the first clock signal and having an inverted output and a non-inverted output, and a second flip-flop having an input coupled to the second clock signal and having an output; and
a voltage controlled oscillator coupled to the first detection loop and coupled to the second detection loop and configured to adjust the first clock signal in response to the second clock signal.

20. The device of claim 19, wherein the frequency detector further comprises:

a third flip-flop having an input coupled to the non-inverted output of the first flip-flop and having an output; and a fourth flip-flop having an input coupled to the inverted output of the first flip-flop and having an output.

21. The device of claim 20, wherein the frequency detector further comprises:
   a first AND gate having a first input coupled to the inverted output of the first flip-flop and having a second input coupled to the output of the third flip-flop, the first AND gate configured to generate a down adjustment signal; and
   a second AND gate having a first input coupled to the non-inverted output of the first flip-flop and having a second input coupled to the output of the fourth flip-flop, the second AND gate configured to generate an up adjustment signal.

22. The device of claim 20, wherein:
   the first flip-flop comprises a clock input coupled to the data input;
   the second flip-flop comprises a clock input coupled to the data input;
   the third flip-flop comprises a reset coupled to the output of the second flip-flop and comprises a clock input coupled to an inverter that is coupled to the to the output of the second flip-flop; and
   the fourth flip-flop comprises a reset coupled to the to the output of the second flip-flop and comprises a clock input that is coupled to the inverter.

23. A device, comprising:
   a data input configured to receive a stream of data bits;
   a first detection loop part coupled to the data input and configured to compare a phase of the stream of data bits to that of a first clock signal and generate a phase error signal based thereupon;
   a second detection loop part coupled to the data input and configured to compare a frequency of the stream of data bits to that of a second clock signal and generate a frequency error signal based thereupon; and
   a common loop part comprising a voltage controlled oscillator coupled to the first and detection loop parts and configured to generate the first and second clock signals as a function of a sum of the phase error signal and the frequency error signal;
   wherein a frequency-lock loop is formed by the second detection loop and the common loop part and comprises a frequency detector coupled to the data input;
   wherein the frequency detector comprises:
      a first flip-flop having an input coupled to the first clock signal and having an inverted output and a non-inverted output; and
      a second flip-flop having an input coupled to the second clock signal and having an output.

24. The device of claim 23, wherein the frequency-lock loop further comprises a charge pump coupled to the frequency detector and configured to generate an up signal or a down signal in response to a frequency detection by the frequency detector.

25. The device of claim 24, wherein the frequency detector further comprises:
   a third flip-flop having an input coupled to the non-inverted output of the first flip-flop and having an output; and
   a fourth flip-flop having an input coupled to the inverted output of the first flip-flop and having an output.

26. An integrated circuit, comprising:
   a data input configured to receive a stream of data bits;
   a first detection loop coupled to the input and configured to generate a phase error signal from a first clock signal and the stream of data bits;
   a second detection loop coupled to the input and configured to generate a frequency error signal recover from a second clock signal and the stream of data bits; and
   a voltage controlled oscillator coupled to the first detection loop and coupled to the second detection loop and configured to adjust the first and second clock signals in response to a sum of the phase and frequency error signals;
   wherein the first detection loop comprises a phase-lock loop having a phase detector coupled to the data input and a charge pump coupled to the phase detector and configured to generate an up signal or a down signal in response to a phase detection by the phase detector;
   wherein the second detection loop comprises a frequency-lock loop having a frequency detector coupled to the data input and a charge pump coupled to the frequency detector and configured to generate an up signal or a down signal in response to a frequency detection by the frequency detector;
   wherein the frequency detector is consisted of four flip-flops, two AND gates and one inverter.

27. The integrated circuit of claim 26, further comprising a single integrated circuit die.

* * * * *